US008120984B2

(12) United States Patent
Huang et al.

(10) Patent No.: US 8,120,984 B2
(45) Date of Patent: Feb. 21, 2012

(54) HIGH-VOLTAGE SELECTING CIRCUIT WHICH CAN GENERATE AN OUTPUT VOLTAGE WITHOUT A VOLTAGE DROP

(75) Inventors: Shao-Chang Huang, Hsinchu (TW);
Wei-Yao Lin, Hsinchu County (TW);
Tang-Lung Lee, Taipei County (TW);
Kun-Wei Chang, Taipei County (TW);
Lin-Fwu Chen, Hsinchu County (TW);
Wen-Hao Lee, Hsinchu County (TW);
Luan-Yi Yen, Ping-Tung County (TW);
Yu-Chun Chang, Yun-Lin County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 219 days.

(21) Appl. No.: 12/729,252

(22) Filed: Mar. 23, 2010

(65) Prior Publication Data
US 2011/0235454 A1    Sep. 29, 2011

(51) Int. Cl.
*G11C 5/14* (2006.01)
(52) U.S. Cl. ............... 365/226; 326/62; 326/63; 326/80; 326/81; 326/83; 327/333; 327/535; 307/80; 365/189.09; 365/189.11
(58) Field of Classification Search .................. 365/226, 365/189.09, 189.11; 326/62, 63, 80, 81, 326/83; 327/333, 535
See application file for complete search history.

(56) References Cited

U.S. PATENT DOCUMENTS

| | | | | |
|---|---|---|---|---|
| 6,133,777 A * | 10/2000 | Savelli | | 327/410 |
| 6,356,481 B1 * | 3/2002 | Micheloni et al. | | 365/185.23 |
| 6,366,505 B1 * | 4/2002 | Fournel | | 365/189.09 |
| 6,380,762 B1 * | 4/2002 | Pancholy et al. | | 326/81 |
| 6,563,372 B1 * | 5/2003 | Fournel | | 327/543 |
| 6,643,162 B2 * | 11/2003 | Takeuchi et al. | | 365/145 |
| 6,664,810 B1 * | 12/2003 | Pancholy et al. | | 326/81 |
| 6,859,917 B2 * | 2/2005 | Shimazaki et al. | | 716/103 |
| 6,903,595 B2 * | 6/2005 | Won | | 327/403 |
| 6,906,944 B2 * | 6/2005 | Takeuchi et al. | | 365/145 |
| 7,091,755 B1 * | 8/2006 | Zhou et al. | | 327/108 |
| 7,215,043 B2 * | 5/2007 | Tsai et al. | | 307/130 |
| 7,283,406 B2 * | 10/2007 | Lu et al. | | 365/189.09 |
| 7,345,510 B1 * | 3/2008 | Drapkin et al. | | 326/80 |
| 7,403,420 B2 * | 7/2008 | Kim | | 365/185.18 |
| 7,683,667 B2 * | 3/2010 | Kim | | 326/63 |
| 7,697,342 B2 * | 4/2010 | Byeon et al. | | 365/185.25 |
| 7,760,560 B2 * | 7/2010 | Lee | | 365/189.11 |
| 7,804,350 B1 * | 9/2010 | Edmondson et al. | | 327/333 |
| 8,022,574 B2 * | 9/2011 | Ryoo | | 307/80 |

* cited by examiner

*Primary Examiner* — Viet Q Nguyen
(74) *Attorney, Agent, or Firm* — Winston Hsu; Scott Margo

(57) ABSTRACT

A high-voltage selecting circuit generates an output voltage with no voltage drop by means of an auxiliary NMOS transistor turning on the corresponding selecting PMOS transistor of the high-voltage selecting circuit when the voltage levels of a first input voltage and a second input voltage are equal. In addition, when one of the first input voltage and the second input voltage is higher than the other one, the high-voltage selecting circuit avoids the leakage current by means of an auxiliary PMOS transistor turning off the corresponding selecting PMOS transistor of the high-voltage selecting circuit. In this way, the high-voltage selecting circuit can correctly generate the output voltage according to the first input voltage and the second input voltage, and avoid the leakage current at the same time.

13 Claims, 9 Drawing Sheets

HIGH-VOLTAGE SELECTING CIRCUIT WHICH CAN GENERATE AN OUTPUT VOLTAGE WITHOUT A VOLTAGE DROP

BACKGROUND OF THE INVENTION

1. Field of the Invention

The present invention is related to a high-voltage selecting circuit, and more particularly, to a high-voltage selecting circuit without a voltage drop.

2. Description of the Prior Art

Please refer to FIG. 1. FIG. 1 is a diagram illustrating a conventional high-voltage selecting circuit 100. The high-voltage selecting circuit 100 includes selecting P-channel Metal Oxide Semiconductor (PMOS) transistors $Q_{PS1}$ and $Q_{PS2}$. The selecting PMOS transistor $Q_{PS1}$ includes a source, a drain, a gate, and a well. The source of the selecting PMOS transistor $Q_{PS1}$ receives an input voltage $V_{IN1}$. The gate of the selecting PMOS transistor $Q_{PS1}$ receives an input voltage $V_{IN2}$. The well of the selecting PMOS transistor $Q_{PS1}$ is coupled to the drain of the selecting PMOS transistor $Q_{PS1}$. The selecting PMOS transistor $Q_{PS2}$ includes a source, a drain, a gate, and a well. The source of the selecting PMOS transistor $Q_{PS2}$ receives the input voltage $V_{IN2}$. The gate of the selecting PMOS transistor $Q_{PS2}$ receives the input voltage $V_{IN1}$. The well of the selecting PMOS transistor $Q_{PS2}$ is coupled to the drain of the selecting PMOS transistor $Q_{PS2}$. The drains of the selecting PMOS transistors $Q_{PS1}$ and $Q_{PS2}$ are coupled together for outputting an output voltage $V_{OUT}$.

The high-voltage selecting circuit 100 is utilized for receiving input voltages $V_{IN1}$ and $V_{IN2}$, and selecting the higher one of the input voltages $V_{IN1}$ and $V_{IN2}$ to generate an output voltage $V_{OUT}$. For instance, it is assumed that the voltage level of the input voltage $V_{IN1}$ is fixed and is equal to the voltage level of a supply voltage $V_{DD}$, which is about 3.3V. When the input voltage $V_{IN2}$ is about 6~7.5V (that is, the input voltage $V_{IN2}$ is higher than the input voltage $V_{IN1}$), the selecting PMOS transistor $Q_{PS1}$ is turned off and the selecting PMOS transistor $Q_{PS2}$ is turned on. Thus, the voltage level of the voltage on the drain of the selecting PMOS transistor $Q_{PS2}$ is equal to the voltage level of the voltage on the source of the selecting PMOS transistor $Q_{PS2}$. In this way, the voltage level of the output voltage $V_{OUT}$ is equal to that of the input voltage $V_{IN2}$, which means the high-voltage selecting circuit 100 selects the higher input voltage $V_{IN2}$ (6~7.5V) as the output voltage $V_{OUT}$. When the input voltage $V_{IN2}$ is about 0V (that is, the input voltage $V_{IN1}$ is higher than the input voltage $V_{IN2}$), the selecting PMOS transistor $Q_{PS2}$ is turned off and the selecting PMOS transistor $Q_{PS1}$ is turned on. In this way, the voltage level of the voltage on the drain of the selecting PMOS transistor $Q_{PS1}$ is equal to the voltage level of the voltage on the source of the selecting PMOS transistor $Q_{PS1}$. Therefore, the voltage level of the output voltage $V_{OUT}$ is equal to that of the input voltage $V_{IN1}$, which means the high-voltage selecting circuit 100 selects the higher input voltage $V_{IN1}$ (3.3V) as the output voltage $V_{OUT}$.

However, when the input voltage $V_{IN2}$ is 3.3V (that is, the voltage level of the input voltage $V_{IN2}$ is equal to that of the input voltage $V_{IN1}$, as shown in FIG. 2), both the selecting PMOS transistors $Q_{PS1}$ and $Q_{PS2}$ are turned off. Meanwhile, the parasitic diode $D_{SP1}$ of the selecting PMOS transistor $Q_{PS1}$ and the parasitic diode $D_{SP2}$ of the selecting PMOS transistor $Q_{PS2}$ are turned on, so that the voltage level of the output voltage $V_{OUT}$ is equal to that of the input voltage $V_{IN1}$ (or $V_{IN2}$) deducting the forward voltage $V_{FW1}$ (or $V_{FW2}$) of the parasitic diodes $D_{SP1}$ ($D_{SP2}$). For instance, when the forward voltages $V_{FW1}$ and $V_{FW2}$ are 0.7V, the output voltage $V_{OUT}$ is 2.6V. However, since both the input voltages $V_{IN1}$ and $V_{IN2}$ are 3.3V, the output voltage $V_{OUT}$ should be 3.3V according to the requirement. In other words, the conventional high-voltage selecting circuit 100 generates the output voltage $V_{OUT}$ with a voltage drop.

More particularly, when the voltage level of the input voltage $V_{IN2}$ is equal to that of the input voltage $V_{IN1}$, the output voltage $V_{OUT}$ (2.6V) of the conventional high-voltage selecting circuit 100 is not at the required voltage level. If the output voltage $V_{OUT}$ (2.6V) is inputted to an inverter 101 coupled between a supply voltage source $V_{DD}$ (3.3V) and a ground (0V), as shown in FIG. 3, both the PMOS transistor $Q_{INVP}$ of the inverter 101 and the NMOS transistor $Q_{INVN}$ are turned on. In this way, a large leakage current $I_{LEAK}$ is generated from the supply voltage source $V_{DD}$ to the ground, causing inconvenience to the users.

SUMMARY OF THE INVENTION

The present invention provides a high-voltage selecting circuit. The high-voltage selecting circuit comprises a first selecting P-channel Metal Oxide Semiconductor (PMOS) transistor, a second selecting PMOS transistor, and a first auxiliary N-channel Metal Oxide Semiconductor (NMOS) transistor. The first selecting PMOS transistor comprises a source, a drain, and a gate. The source of the first selecting PMOS transistor is utilized for receiving a first input voltage. The second selecting PMOS transistor comprises a source, a drain, and a gate. The source of the second selecting PMOS transistor is utilized for receiving a second input voltage. The drain of the second selecting PMOS transistor is coupled to the drain of the first selecting PMOS transistor. The gate of the second selecting PMOS transistor is coupled to the source of the first selecting PMOS transistor. The first auxiliary NMOS transistor comprises a source, a drain, and a gate. The source of the first auxiliary NMOS transistor is coupled to the gate of the first selecting PMOS transistor. The drain of the first auxiliary NMOS transistor is utilized for receiving the second input voltage. The gate of the first auxiliary NMOS transistor is utilized for receiving the first input voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
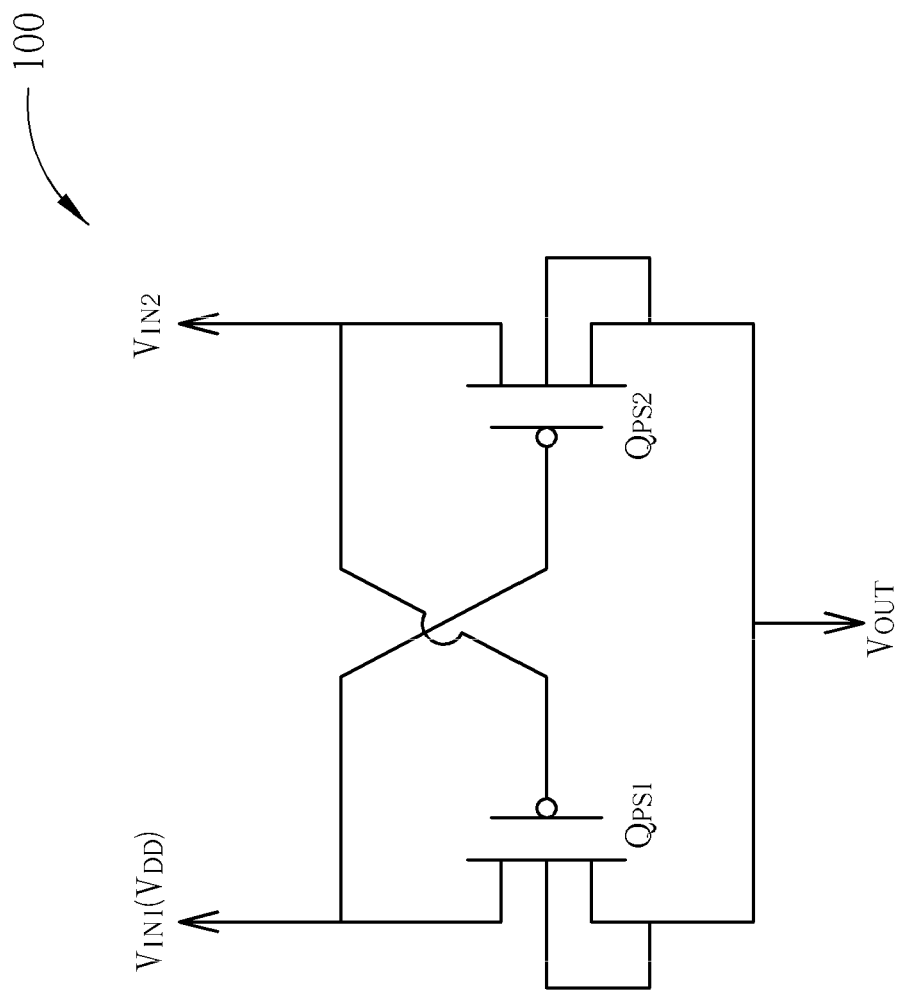
FIG. 1 is a diagram illustrating a conventional high-voltage selecting circuit.
Figure 2:
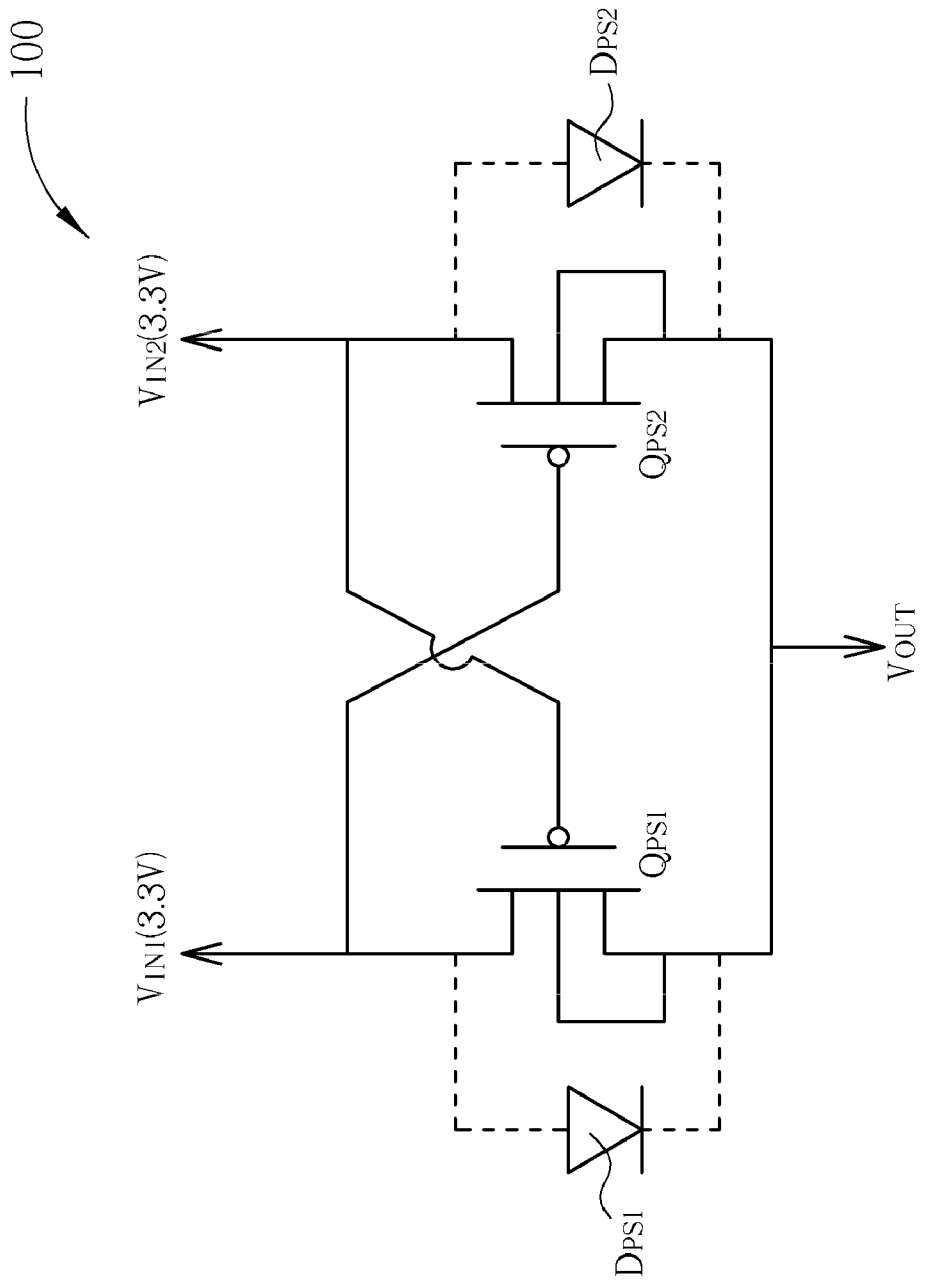
FIG. 2 is a diagram illustrating the conventional high-voltage selecting circuit incorrectly generates the output voltage.
Figure 3:
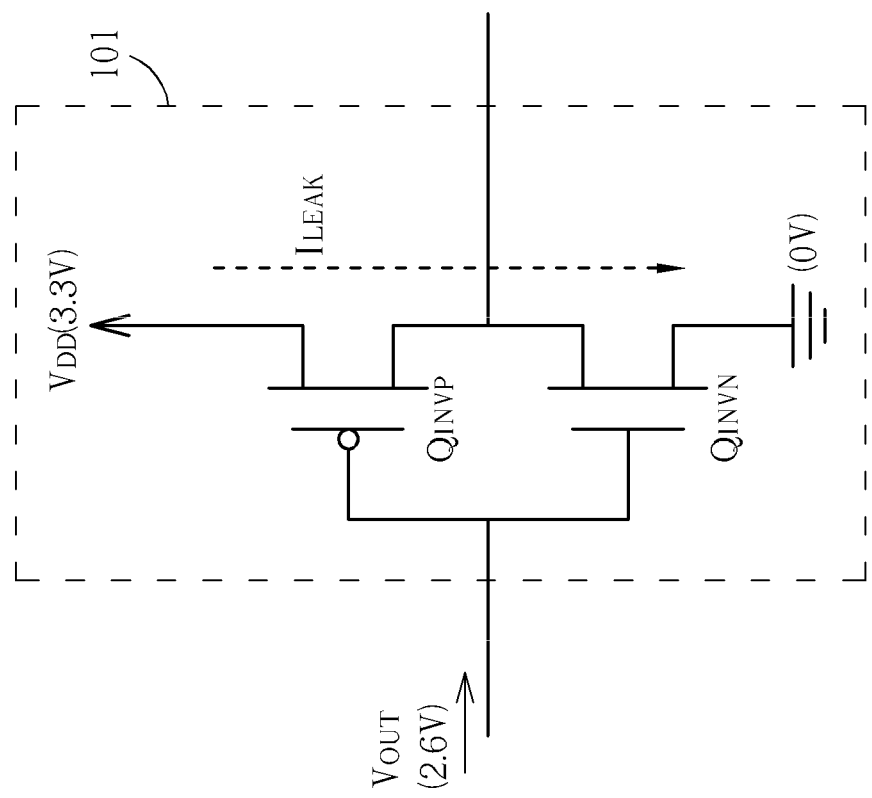
FIG. 3 is a diagram illustrating the output voltage of the conventional high-voltage selecting circuit inputted to an inverter.
Figure 4:
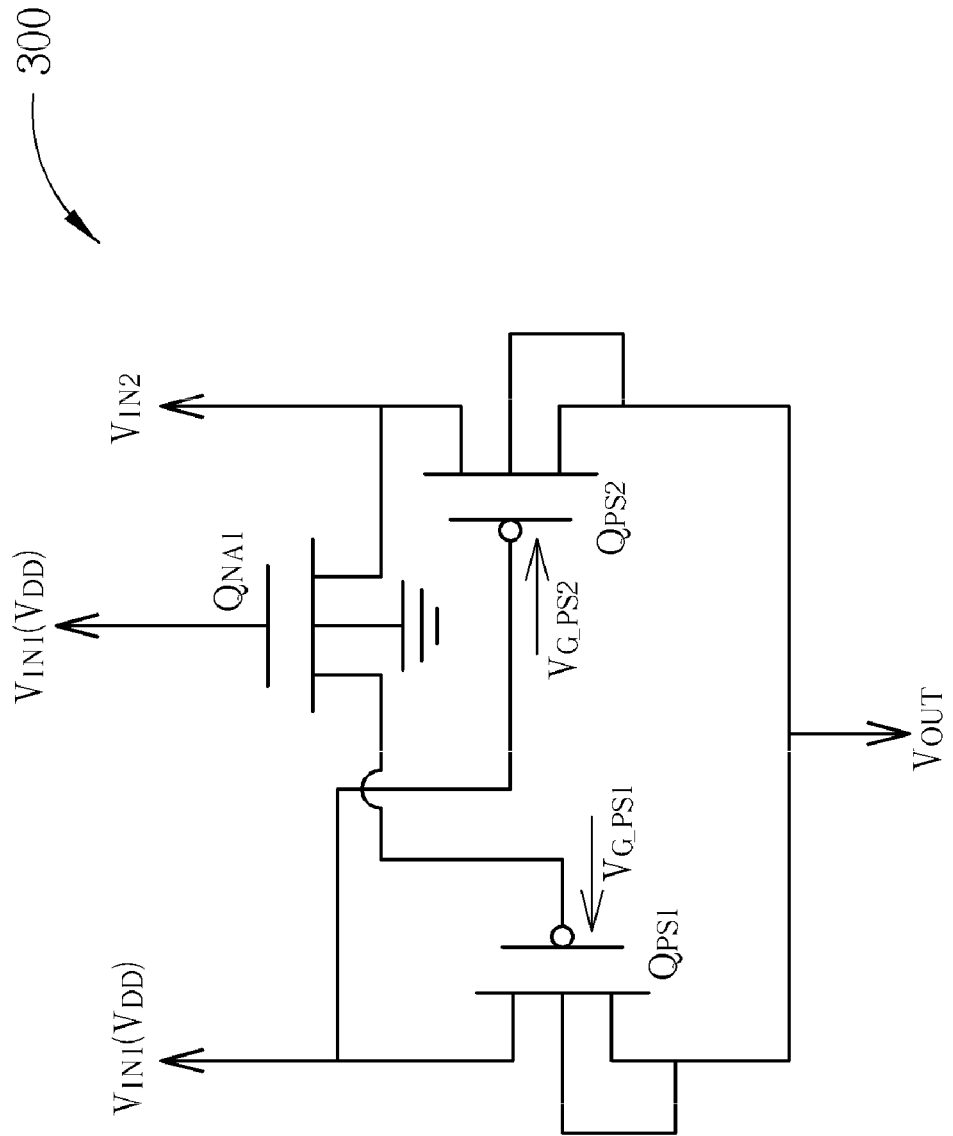
FIG. 4 is a diagram illustrating a high-voltage selecting circuit according to a first embodiment of the present invention.

Please refer to FIG. 4. FIG. 4 is a diagram illustrating a high-voltage selecting circuit 300 according to a first embodiment of the present invention. The high-voltage selecting circuit 300 includes selecting PMOS transistors $Q_{PS1}$ and $Q_{PS2}$, and an auxiliary NMOS transistor $Q_{NA1}$. Each of the selecting PMOS transistors $Q_{PS1}$ and $Q_{PS2}$, and the auxiliary NMOS transistor $Q_{NA1}$ includes a source, a drain, a gate, and a well. The source of the selecting PMOS transistor $Q_{PS1}$ receives an input voltage $V_{IN1}$. The gate of the selecting PMOS transistor $Q_{PS1}$ is coupled to the source of the auxiliary NMOS transistor $Q_{NA1}$. The drain of the selecting PMOS transistor $Q_{PS1}$ is coupled to the drain of the selecting PMOS transistor $Q_{PS2}$ for outputting the output voltage $V_{OUT}$. The well of the selecting PMOS transistor $Q_{PS1}$ is coupled to the drain of the selecting PMOS transistor $Q_{PS1}$. The source of the selecting PMOS transistor $Q_{PS2}$ receives an input voltage $V_{IN2}$. The gate of the selecting PMOS transistor $Q_{PS2}$ receives the input voltage $V_{IN1}$. The well of the selecting PMOS transistor $Q_{PS2}$ is coupled to the drain of the selecting PMOS transistor $Q_{PS2}$. The gate of the auxiliary NMOS transistor $Q_{NA1}$ receives the input voltage $V_{IN1}$. The drain of the auxiliary NMOS transistor $Q_{NA1}$ receives the input voltage $V_{IN2}$. The well of the auxiliary NMOS transistor $Q_{NA1}$ is coupled to a ground.

The voltage level of the input voltage $V_{IN1}$ is assumed to be fixed and equal to the voltage level of a supply voltage $V_{DD}$, as an example for illustrating the operational principle of the high-voltage selecting circuit 300, wherein the supply voltage $V_{DD}$ is about 3.3V.

When the input voltage $V_{IN2}$ is higher than the input voltage $V_{IN1}$ (for example, the input voltage $V_{IN2}$ is about 6~7.5V), the selecting PMOS transistor $Q_{PS2}$ is turned on. Therefore, the voltage level of the voltage on the drain of the selecting PMOS transistor $Q_{PS2}$ is pulled up by the selecting PMOS transistor $Q_{PS2}$ to be equal to that of the voltage on the source of the selecting PMOS transistor $Q_{PS2}$. In this way, the voltage level of the output voltage $V_{OUT}$ is equal to that of the input voltage $V_{IN2}$ (6~7.5V), which means the high-voltage selecting circuit 300 selects the higher input voltage $V_{IN2}$ (6~7.5V) as the output voltage $V_{OUT}$.

When the input voltage $V_{IN1}$ is higher than the input voltage $V_{IN2}$ (for example, the input voltage $V_{IN2}$ is about 0V), the selecting PMOS transistor $Q_{PS2}$ is turned off, and the auxiliary NMOS transistor $Q_{NA1}$ is turned on so that the voltage level of the gate voltage $V_{G\_PS1}$ of the selecting PMOS transistor $Q_{PS1}$ is pulled by the auxiliary NMOS transistor $Q_{NA1}$ to be equal to the input voltage $V_{IN2}$ (0V). As a result, the selecting PMOS transistor $Q_{PS1}$ is turned on, so that the voltage level of the voltage on the drain of the selecting PMOS transistor $Q_{PS1}$ is equal to the voltage level of the voltage on the source of the selecting PMOS transistor $Q_{PS1}$. In this way, the voltage level of the output voltage $V_{OUT}$ is equal to that of the input voltage $V_{IN1}$ (3.3V). That is, when the input voltage $V_{IN1}$ (3.3V) is higher than the input voltage $V_{IN2}$ (0V), the high-voltage selecting circuit 300 selects the higher input voltage $V_{IN1}$ (3.3V) as the output voltage $V_{OUT}$.

When the voltage level of the input voltage $V_{IN1}$ is equal to that of the input voltage $V_{IN2}$ (for example, the input voltage $V_{IN2}$ is 3.3V), the auxiliary NMOS transistor $Q_{NA1}$ is turned on, so that the voltage level of the gate voltage $V_{G\_PS1}$ of the selecting PMOS transistor $Q_{PS1}$ is pulled by the auxiliary NMOS transistor $Q_{NA1}$ to be equal to the voltage level of the gate voltage ($V_{IN1}$) of the auxiliary NMOS transistor $Q_{NA1}$ deducting the threshold voltage $V_{TH\_NA1}$ of the auxiliary NMOS transistor $Q_{NA1}$. Since the well of the auxiliary NMOS transistor $Q_{NA1}$ is coupled to the ground, the body effect of the auxiliary NMOS transistor $Q_{NA1}$ is enhanced, so that the magnitude of the threshold voltage $V_{TH\_NA1}$ of the auxiliary NMOS transistor $Q_{NA1}$ is larger than the magnitude of the threshold voltage $V_{TH\_PS1}$ of the selecting PMOS transistor $Q_{PS1}$. Hence, the difference between the voltage level of the input voltage $V_{IN1}$ (3.3V) and the voltage level of the gate voltage $V_{G\_PS1}$ (3.3-$V_{TH\_NA1}$) is larger than the threshold voltage $V_{TH\_PS1}$ of the selecting PMOS transistor $Q_{PS1}$, so that the selecting PMOS transistor $Q_{PS1}$ is turned on. In this way, the voltage level of the voltage on the drain of the selecting PMOS transistor $Q_{PS1}$ is pulled by the selecting PMOS transistor $Q_{PS1}$ to be equal to that of the voltage on the source of the selecting PMOS transistor $Q_{PS1}$, so that the voltage level of the output voltage $V_{OUT}$ is equal to that of the input voltage $V_{IN1}$ (3.3V). Therefore, compared with the conventional high-voltage selecting circuit 100, when the voltage level of the input voltage $V_{IN2}$ is equal to that of the input voltage $V_{IN1}$, the high-voltage selecting circuit 300 correctly generates the output voltage $V_{OUT}$ by means of the auxiliary NMOS transistor $Q_{NA1}$ reducing the gate voltage $V_{G\_PS1}$ to turn on the selecting PMOS transistor $Q_{PS1}$.

Figure 5:
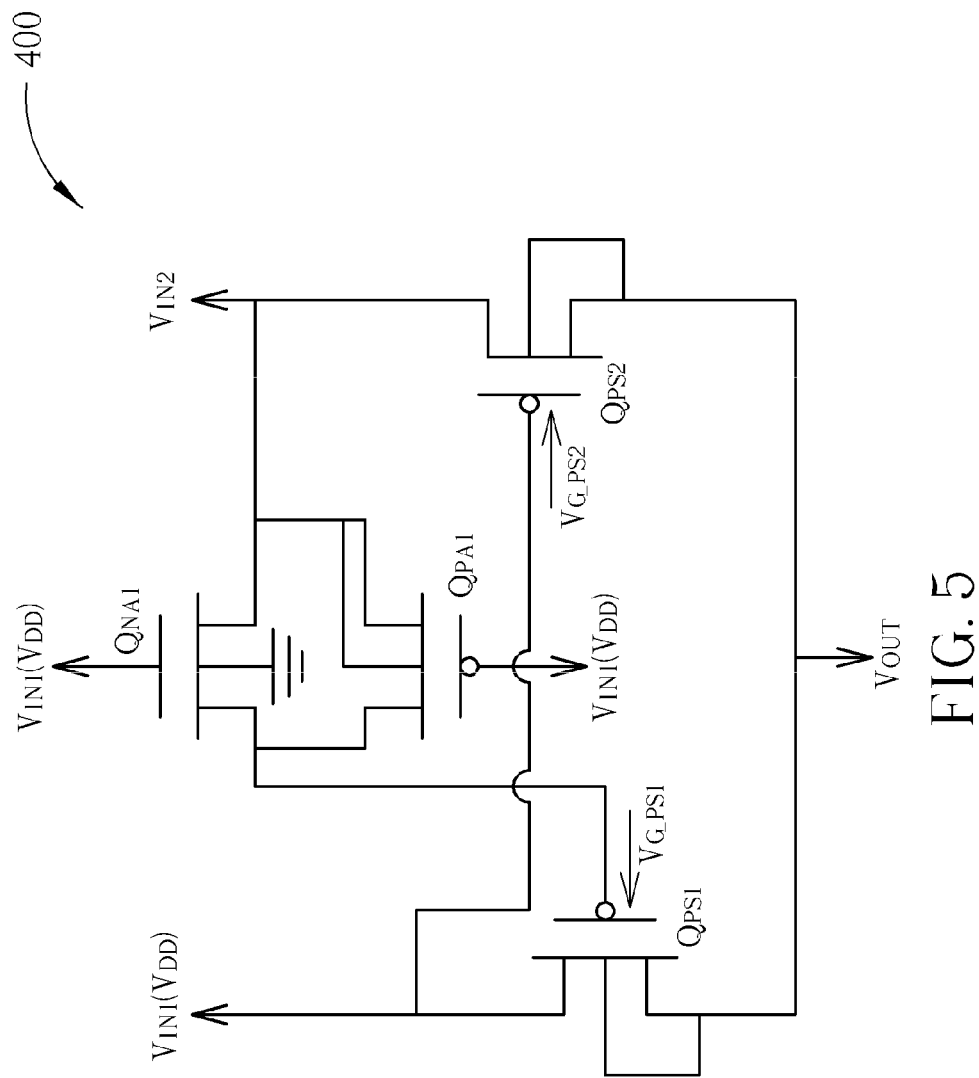
FIG. 5 is a diagram illustrating a high-voltage selecting circuit according to a second embodiment of the present invention.

Please refer to FIG. 5. FIG. 5 is a diagram illustrating a high-voltage selecting circuit 400 according to a second embodiment of the present invention. Compared with the high-voltage selecting circuit 300, the high-voltage selecting circuit 400 further includes an auxiliary PMOS transistor $Q_{PA1}$. The auxiliary PMOS transistor $Q_{PA1}$ includes a source, a gate, a drain, and a well. The source of the auxiliary PMOS transistor $Q_{PA1}$ receives the input voltage $V_{IN2}$. The gate of the auxiliary PMOS transistor $Q_{PA1}$ receives the input voltage $V_{IN1}$. The drain of the auxiliary PMOS transistor $Q_{PA1}$ is coupled to the gate of the selecting PMOS transistor $Q_{PS1}$.

Figure 6:
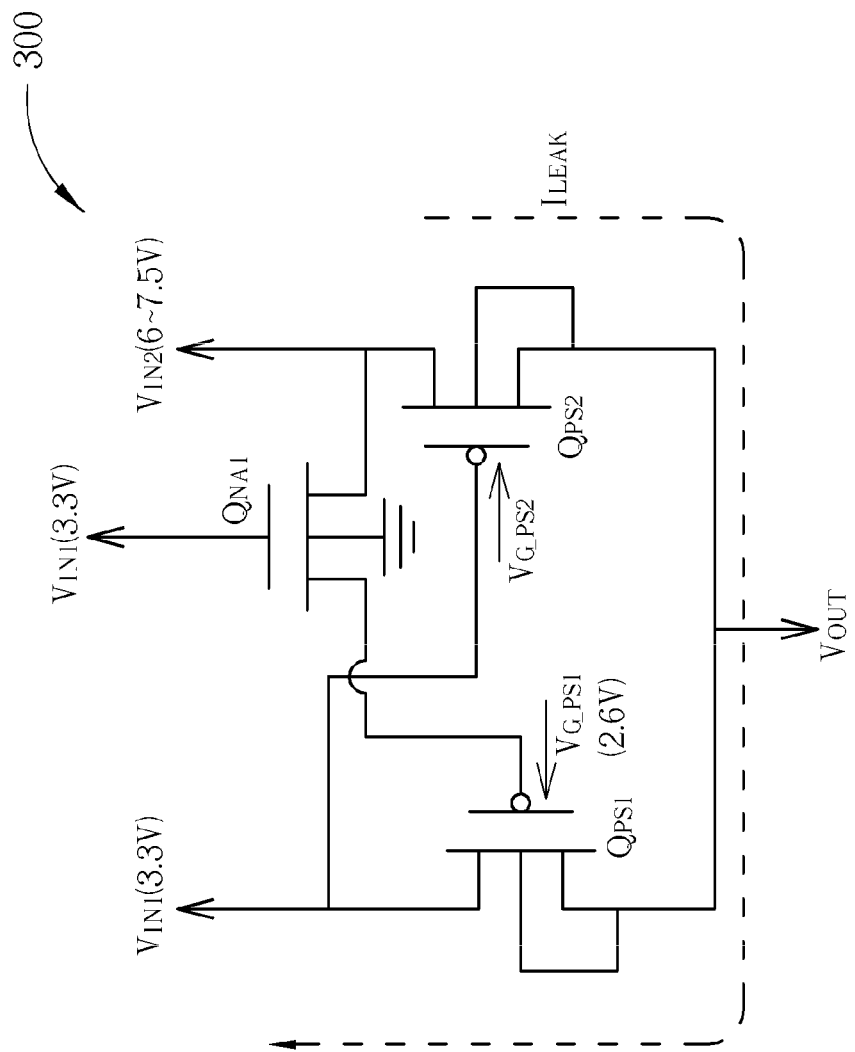
FIG. 6 is a diagram illustrating a leakage current of the high-voltage selecting circuit of FIG. 4.

In the high-voltage selecting circuit 300 shown in FIG. 4, when the input voltage $V_{IN2}$ is higher than the input voltage $V_{IN1}$ (for example, the input voltage $V_{IN2}$ is about 6~7.5V), the voltage level of the gate voltage $V_{G\_PS1}$ is pulled by the auxiliary transistor $Q_{NA1}$ to be equal to the voltage level of the gate voltage ($V_{IN1}$) of the auxiliary NMOS transistor $Q_{NA1}$ deducting the threshold voltage $V_{TH\_NA1}$ of the auxiliary NMOS transistor $Q_{NA1}$. Therefore, the selecting PMOS transistor $Q_{PS1}$ is turned on. In this way, since both the selecting PMOS transistors $Q_{PS1}$ and $Q_{PS2}$ are turned on, a leakage current $I_{LEAK}$ may flow from the input voltage $V_{IN2}$ to $V_{IN1}$, as shown in FIG. 6. However, in the high-voltage selecting circuit 400, when the input voltage $V_{IN2}$ (6~7.5V) is higher than the input voltage $V_{IN1}$ (3.3V), the auxiliary PMOS transistor $Q_{PA1}$ is turned on and pulls the voltage level of the gate voltage $V_{G\_PS1}$ to be equal to that of the input voltage $V_{IN2}$ (6~7.5V). In this way, the selecting PMOS transistor $Q_{PS1}$ is turned off, so that the leakage current $I_{LEAK}$ is avoided in the high-voltage selecting circuit 400.

Figure 7:
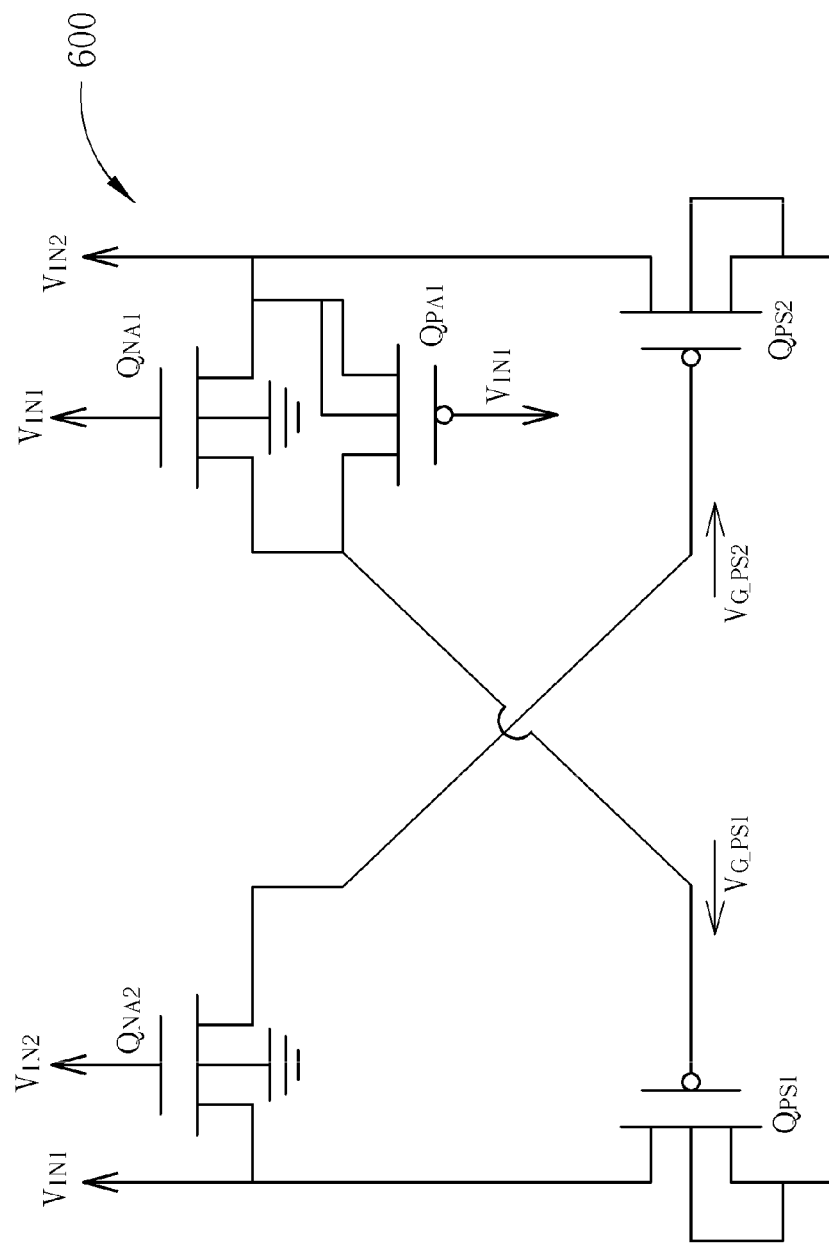
FIG. 7 is a diagram illustrating a high-voltage selecting circuit according to a third embodiment of the present invention.

Please refer to FIG. 7. FIG. 7 is a diagram illustrating a high-voltage selecting circuit 600 according to a third embodiment of the present invention. Compared with the high-voltage selecting circuit 400, the high-voltage selecting circuit 600 further includes an auxiliary NMOS transistor $Q_{NA2}$. The auxiliary NMOS transistor $Q_{NA2}$ includes a source, a drain, a gate, a well. The source of the auxiliary NMOS transistor $Q_{NA2}$ is coupled to the gate of the selecting PMOS transistor $Q_{PS2}$. The gate of the auxiliary NMOS transistor $Q_{NA2}$ receives the input voltage $V_{IN2}$. The drain of the auxiliary NMOS transistor $Q_{NA2}$ receives the input voltage $V_{IN1}$. The well of the auxiliary NMOS transistor $Q_{NA2}$ is coupled to the ground for enhancing the body effect, so that the magnitude of the threshold voltage $V_{TH\_NA2}$ of the auxiliary NMOS transistor Q2 is larger than the magnitude of the threshold voltage $V_{TH\_PS2}$ of the selecting PMOS transistor $Q_{PS2}$. Consequently, when the voltage level of the input voltage $V_{IN1}$ is equal to that of the input voltage $V_{IN2}$, the gate voltage $V_{G\_PS2}$ is controlled to be low enough so that the selecting PMOS transistor $Q_{PS2}$ is turned on. In other words, when the voltage level of the input voltage $V_{IN1}$ is equal to that of the input voltage $V_{IN2}$, both the selecting PMOS transistors $Q_{PS1}$ are $Q_{PS2}$ are turned on, so that the speed of the output voltage $V_{OUT}$ rising to the required voltage level (3.3V) increases, reducing the response time of the high-voltage selecting circuit 600.

Figure 8:
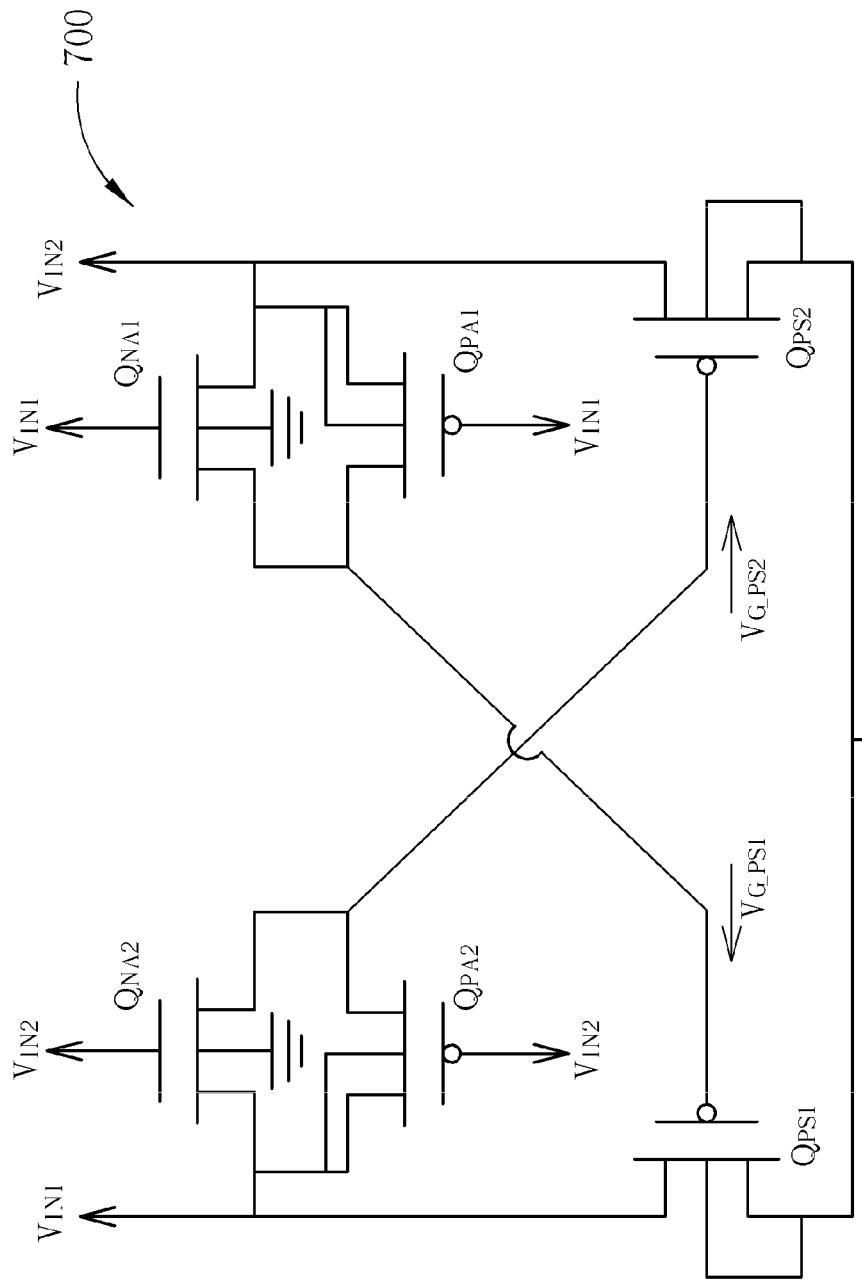
FIG. 8 is a diagram illustrating a high-voltage selecting circuit according to a fourth embodiment of the present invention.

Please refer to FIG. 8. FIG. 8 is a diagram illustrating a high-voltage selecting circuit 700 according to a fourth embodiment of the present invention. Compared with the high-voltage selecting circuit 600, the high-voltage selecting circuit 700 further includes an auxiliary PMOS transistor $Q_{PA2}$. The auxiliary PMOS transistor $Q_{PA2}$ includes a source, a gate, a drain, and a well. The source of the auxiliary PMOS transistor $Q_{PA2}$ receives the input voltage $V_{IN1}$. The gate of the auxiliary PMOS transistor $Q_{PA2}$ receives the input voltage $V_{IN2}$. The drain of the auxiliary PMOS transistor $Q_{PA2}$ is coupled to the gate of the selecting PMOS transistor $Q_{PS2}$. In the high-voltage selecting circuit 600, if the input voltage $V_{IN1}$ is about 6~7.5V and the input voltage $V_{IN2}$ is 3.3V, the selecting PMOS transistor $Q_{PS2}$ is turned on by the auxiliary NMOS transistor $Q_{NA2}$. Thus, a leakage current $I_{LEAK}$ may flow from the input voltage $V_{IN1}$ to $V_{IN2}$. However, in the high-voltage selecting circuit 700, when the input voltage $V_{IN1}$ is about 6~7.5V and the input voltage $V_{IN2}$ is 3.3V, the auxiliary PMOS transistor $Q_{PA2}$ is turned on, so that the gate voltage $V_{G\_PS2}$ is pulled to be 6~7.5. In this way, the selecting PMOS transistor $Q_{PS2}$ is turned off so that the leakage current $I_{LEAK}$ is avoided. In other words, no matter the input voltage $V_{IN1}$ is higher, lower, or equal to the input voltage $V_{IN2}$, the high-voltage selecting circuit 700 can correctly generate the output voltage $V_{OUT}$ and avoid the leakage current $I_{LEAK}$ at the same time.

Figure 9:
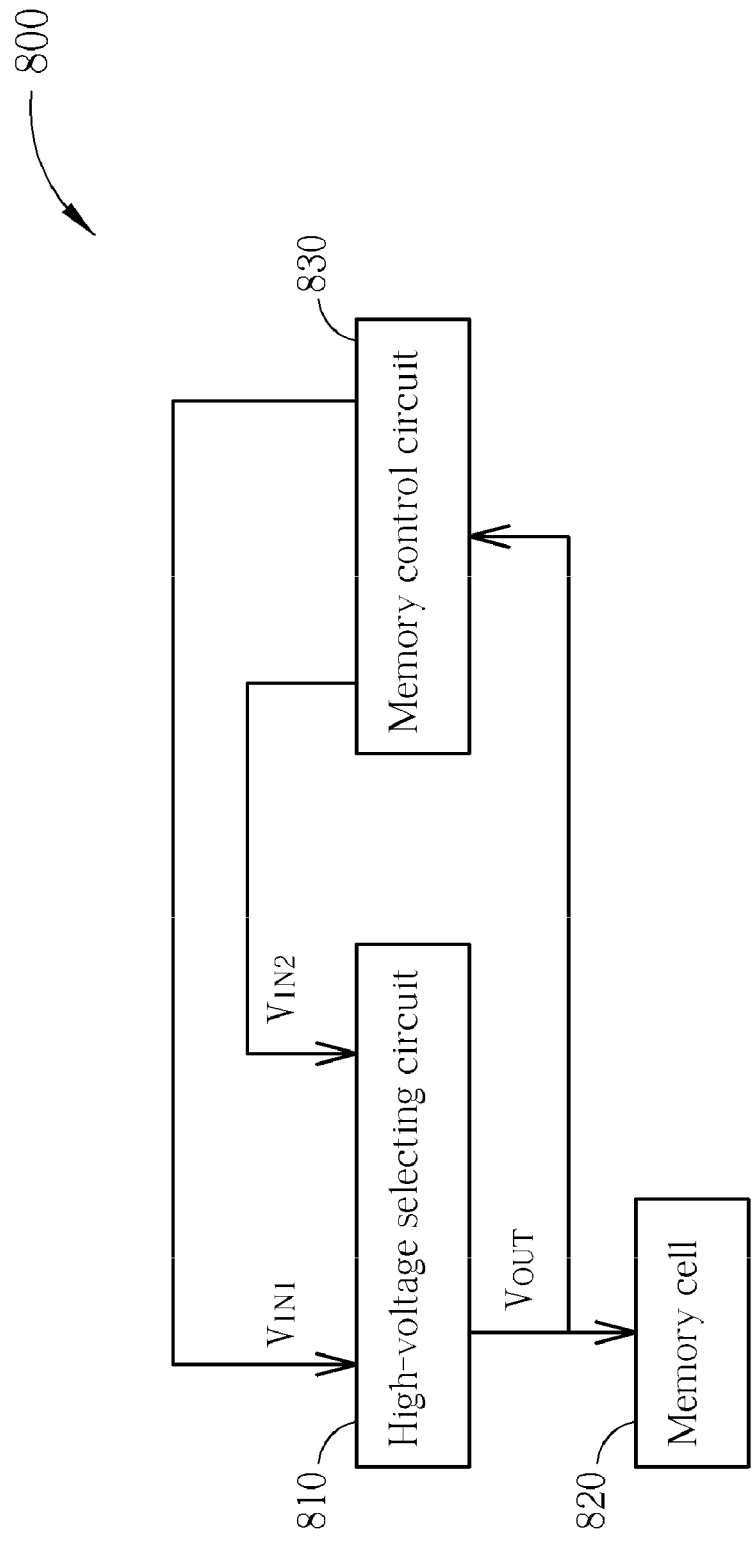
FIG. 9 is a diagram illustrating a memory module of the present invention.

The high-voltage selecting circuit of the present invention can be utilized in various applications. For instance, the high-voltage selecting circuit provides the output voltage as a supply voltage to an external load. In addition, the high-voltage selecting circuit of the present invention can be applied in a memory module. Please refer to FIG. 9. FIG. 9 is a diagram illustrating a memory module 800 of the present invention. The memory module 800 includes a high-voltage selecting circuit 810, a memory cell 820, and a memory control circuit 830. The structure and the operational principle of the high-voltage selecting circuit 810 is similar to those of the high-voltage selecting circuit 300, 400, 600, or 700, and thus will not be repeated again for brevity. The memory cell 820 enters a program mode or a read mode according to the output voltage $V_{OUT}$ of the high-voltage selecting circuit 810. For instance, when the output voltage $V_{OUT}$ is 3.3V, the memory cell 820 operates in the read mode. Meanwhile, the memory cell 820 is not allowed to be written data. When the output voltage $V_{OUT}$ is 6~7.5V, the memory cell 820 operates in the program mode. Meanwhile, the memory cell 820 is allowed to be written data. In this way, the memory control circuit 830 can control the voltage levels of the input voltages $V_{IN1}$ and $V_{IN2}$ according to the output voltage $V_{OUT}$ so as to control the memory cell 820 entering the read mode or the program mode.

In conclusion, the high-voltage selecting circuit provided by the present invention generates the output voltage without a voltage drop by means of the auxiliary NMOS transistor turning on the corresponding selecting PMOS transistor when the voltage levels of the first input voltage and the second input voltage are equal. In addition, when one of the first and the second input voltages is higher than the other one, the high-voltage selecting circuit of the present invention avoids the leakage current by means of the auxiliary PMOS transistor turning off the corresponding selecting PMOS transistor, causing a great convenience.

Those skilled in the art will readily observe that numerous modifications and alterations of the device and method may be made while retaining the teachings of the invention.

What is claimed is:

1. A high-voltage selecting circuit comprising:
    a first selecting P-channel Metal Oxide Semiconductor (PMOS) transistor comprising:
        a source for receiving a first input voltage;
        a drain; and
        a gate;
    a second selecting PMOS transistor, comprising:
        a source for receiving a second input voltage;
        a drain coupled to the drain of the first selecting PMOS transistor; and
        a gate coupled to the source of the first selecting PMOS transistor; and
    a first auxiliary N-channel Metal Oxide Semiconductor (NMOS) transistor, comprising:
        a source coupled to the gate of the first selecting PMOS transistor;
        a drain for receiving the second input voltage; and
        a gate for receiving the first input voltage.

2. The high-voltage selecting circuit of claim 1, wherein a magnitude of a threshold voltage of the first selecting PMOS transistor is smaller than a magnitude of a threshold voltage of the first auxiliary NMOS transistor.

3. The high-voltage selecting circuit of claim 1, wherein the first selecting PMOS transistor further comprises a well coupled to the drain of the first selecting PMOS transistor; the second selecting PMOS transistor further comprises a well coupled to the drain of the second selecting PMOS transistor; and the first auxiliary NMOS transistor further comprises a well coupled to ground.

4. The high-voltage selecting circuit of claim 1, wherein the first input voltage having a fixed voltage level.

5. The high-voltage selecting circuit of claim 4, wherein the first input voltage is about 3.3V and the second input voltage is about 0V, about 3.3V, or about 6~7.5V.

6. The high-voltage selecting circuit of claim 1, further comprising:
    a first auxiliary PMOS transistor, comprising:
        a source for receiving the second input voltage;
        a drain coupled to the gate of the first selecting PMOS transistor; and
        a gate for receiving the first input voltage.

7. The high-voltage selecting circuit of claim 6, wherein the first auxiliary PMOS transistor further comprises a well coupled to the source of the first auxiliary PMOS transistor.

8. The high-voltage selecting circuit of claim 6, further comprising:
    a second auxiliary NMOS transistor, comprising:
        a source coupled to the gate of the second selecting PMOS transistor;
        a drain for receiving the first input voltage; and
        a gate for receiving the second input voltage.

9. The high-voltage selecting circuit of claim 8, wherein a magnitude of a threshold voltage of the second selecting PMOS transistor is smaller than a magnitude of a threshold voltage of the second auxiliary NMOS transistor.

10. The high-voltage selecting circuit of claim 8, wherein the second auxiliary NMOS transistor further comprises a well coupled to ground.

11. The high-voltage selecting circuit of claim 8, further comprising:
   a second auxiliary PMOS transistor, comprising:
      a source for receiving the first input voltage;
      a drain coupled to the gate of the second selecting PMOS transistor; and
      a gate for receiving the second input voltage.

12. The high-voltage selecting circuit of claim 11, wherein the second auxiliary PMOS transistor further comprises a well coupled to the source of the second auxiliary PMOS transistor.

13. A memory module, comprising:
   the high-voltage selecting circuit of claim 1;
   a memory cell for entering a program mode or a read mode according to an output voltage of the high-voltage selecting circuit; and
   a memory control circuit for controlling a voltage level of the first input voltage and a voltage level of the second input voltage according to the output voltage of the high-voltage selecting circuit so as to control the memory cell.

* * * * *